(12) United States Patent
Frank (10) Patent No.: US 6,803,835 B2
(45) Date of Patent: Oct. 12, 2004

(54) INTEGRATED FILTER BALUN

(75) Inventor: Michael L. Frank, Los Gatos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/944,553

(22) Filed: Aug. 30, 2001

(65) Prior Publication Data

US 2003/0042992 A1 Mar. 6, 2003

(51) Int. Cl.$^7$ .............................................. H03H 5/00
(52) U.S. Cl. ......................... 333/26; 333/25; 333/204; 333/219
(58) Field of Search ............................ 333/25, 26, 204, 333/219

(56) References Cited

U.S. PATENT DOCUMENTS

| | | | | |
|---|---|---|---|---|
| 3,571,722 A | * | 3/1971 | Vendelin | 333/25 |
| 4,302,739 A | * | 11/1981 | Hallford | 333/204 |
| 4,667,173 A | * | 5/1987 | Okochi | 333/177 |
| 5,164,690 A | * | 11/1992 | Yeh et al. | 333/203 |
| 5,361,050 A | * | 11/1994 | Einbinder | 333/204 |
| 5,428,840 A | * | 6/1995 | Sadhir | 333/26 |
| 5,475,346 A | * | 12/1995 | Mullett | 333/25 |
| 5,534,830 A | * | 7/1996 | Ralph | 333/117 |
| 5,697,088 A | * | 12/1997 | Gu | 455/307 |
| 5,705,960 A | * | 1/1998 | Izumiyama | 333/246 |
| 5,757,248 A | * | 5/1998 | Bardal | 333/193 |
| 5,781,078 A | * | 7/1998 | Jones | 333/12 |
| 5,825,263 A | * | 10/1998 | Falt | 333/204 |
| 5,949,299 A | * | 9/1999 | Harada | 333/25 |
| 6,137,376 A | * | 10/2000 | Imbornone et al. | 333/25 |
| 6,215,374 B1 | * | 4/2001 | Petrovic | 333/177 |
| 6,396,362 B1 | * | 5/2002 | Mourant et al. | 333/25 |
| 6,426,725 B2 | * | 7/2002 | Hiroshima et al. | 343/741 |
| 6,525,626 B2 | * | 2/2003 | Mandai et al. | 333/134 |
| 6,542,055 B1 | * | 4/2003 | Frank et al. | 333/133 |
| 6,608,533 B2 | * | 8/2003 | Kushitani et al. | 333/126 |
| 2002/0034934 A1 | * | 3/2002 | Watanabe et al. | 455/318 |
| 2002/0171508 A1 | * | 11/2002 | Harada et al. | 333/133 |
| 2002/0175002 A1 | * | 11/2002 | Sakakura et al. | |
| 2003/0020568 A1 | * | 1/2003 | Mitzutani et al. | 333/26 |
| 2003/0025571 A1 | * | 2/2003 | Maekawa et al. | 333/26 |

FOREIGN PATENT DOCUMENTS

GB     2 243 038 A   *   10/1991   ............ H03H/7/42

* cited by examiner

Primary Examiner—Michael Tokar
Assistant Examiner—Khai Nguyen (57) ABSTRACT

A component that includes a first structure that is integrated with a second structure. The first structure is a lumped balanced to unbalanced circuit (balun) and the second structure is a resonator-based filter. The function of the balun is to move a signal from a differential form to a single ended form or from a single ended form to a differential form. The component has an area that is comparable to the area needed to implement the balun alone. However, the component now provides a filter function. Preferably, the substrate of the first structure also acts as a substrate for the second structure.

17 Claims, 8 Drawing Sheets

INTEGRATED FILTER BALUN

FIELD OF THE INVENTION

The present invention relates generally to components for use in radio frequency (RF) and microwave designs, and more particularly, to an integrated filter balun.

BACKGROUND OF THE INVENTION

In radio frequency (RF) and microwave designs, there is often the need to convert a signal from a single-ended regime to a differential regime. For example, in a receiver design, an antenna typically provides a signal that is in a single-ended form. However, there is typically a point in the signal path where a differential signal is expected by a particular circuit or component. In this regard, a circuit is needed to convert the single-ended signal to a differential signal that is acceptable to that circuit or component.

Similarly, there is often the need to convert a signal from a differential regime back to a single-ended regime. For example, in a transmitter design, a differential signal that is being provided by an amplifier is provided to an antenna for transmission. However, the antenna typically has a single-ended input. Consequently, a circuit is needed to convert the differential signal provided by the amplifier to a single-ended signal that is acceptable to the antenna.

Accordingly, an important component in RF and microwave design is the balanced to unbalanced circuit (or "balun") that provides the required functionality to convert a signal between a single-ended regime to a differential regime and visa-versa.

Another important component in a designer's toolbox is the filter. The increase in wireless communications services is forcing more and more channels into less frequency spectrum. To avoid interference, these systems must comply with very stringent filtering requirements. Consequently, the filter component is important for helping these systems to handle the power levels and to provide the needed isolation.

Currently, the filter component and balun component are provided as separate components with their own respective housing. These separate components are then typically soldered to a printed circuit board to achieve a desired functionality. The separate filter component and balun component increase system cost, occupy valuable board space and require extra design effort.

Since many designs are implemented in portable handsets or other portable computing devices, the size and weight of the components that are utilized in a design are important considerations. Consequently, it is desirable for there to be a technology that integrates the filter functionality and the balun functionality into a single component, thereby saving board space, decreasing system costs, and simplifying the design effort.

Based on the foregoing, there remains a need for an integrated component that overcomes the disadvantages set forth previously.

SUMMARY OF THE INVENTION

According to one embodiment of the present invention, a component that includes a first structure that is integrated with a second structure is provided. The first structure is a lumped balanced to unbalanced circuit (balun) and the second structure is a resonator-based filter. The function of the balun is to move a signal from a differential form to a single ended form or from a single ended form to a differential form. The component has an area that is comparable to the area needed to implement the balun alone. However, the component now provides a filter function. Preferably, the substrate of the first structure also acts as a substrate for the second structure.

According to one embodiment, the component of the present invention includes a filter with a single ended input and a single ended output. When the filter is the first stage, the balun has a single ended input for coupling to the output of the filter and a differential output. When the filter is the second stage, the balun has a differential input and a single ended output for coupling to the input of the filter.

According to another embodiment, the component of the present invention includes a filter with a differential input and a differential output. When the filter is the first stage, the balun has a differential input that is coupled to the output of the filter and a single ended output. When the filter is the second stage, the balun has a single ended input and a differential output coupled to the input of the filter.

In one embodiment, the filter is implemented with a resonator-based filter that includes a single-ended input and a single-ended output, such as a half-ladder filter. Alternatively, the filter may be implemented with a resonator-based filter that includes differential inputs and differential outputs, such as a full-ladder filter or a lattice filter, or a combination thereof.

In one embodiment, the balun is implemented with transmission lines that act as impedance transformers. Alternatively, the balun is implemented with lumped equivalent circuits.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

An integrated filter balun component is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Components Employing Filter With Single Ended Input and Single Ended Output

Figure 1:
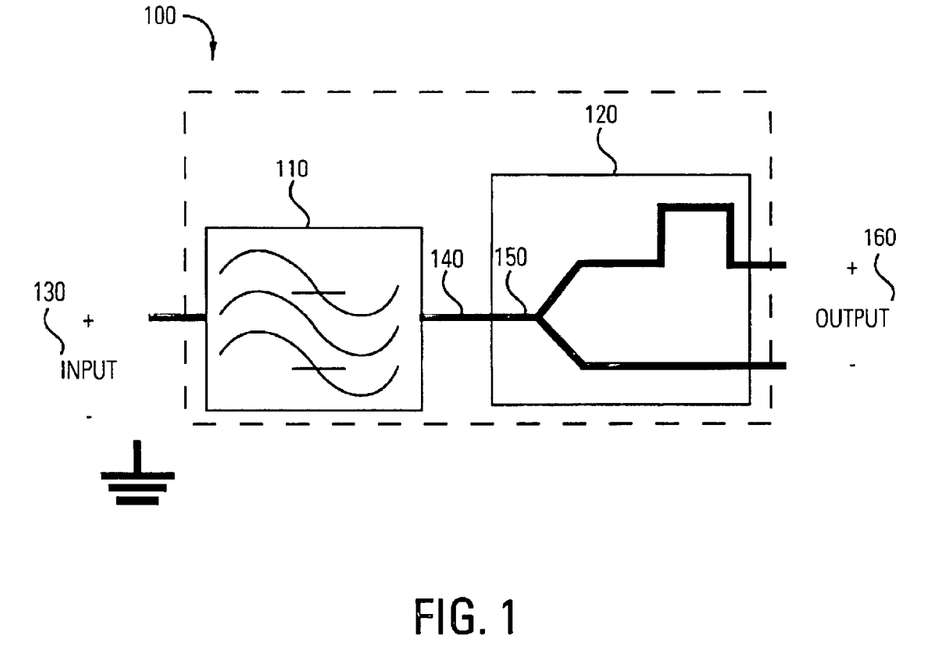
FIG. 1 illustrates a component that has a single-ended input and a differential output and that employs a single-ended filter according to one embodiment of the present invention.
Figure 2:
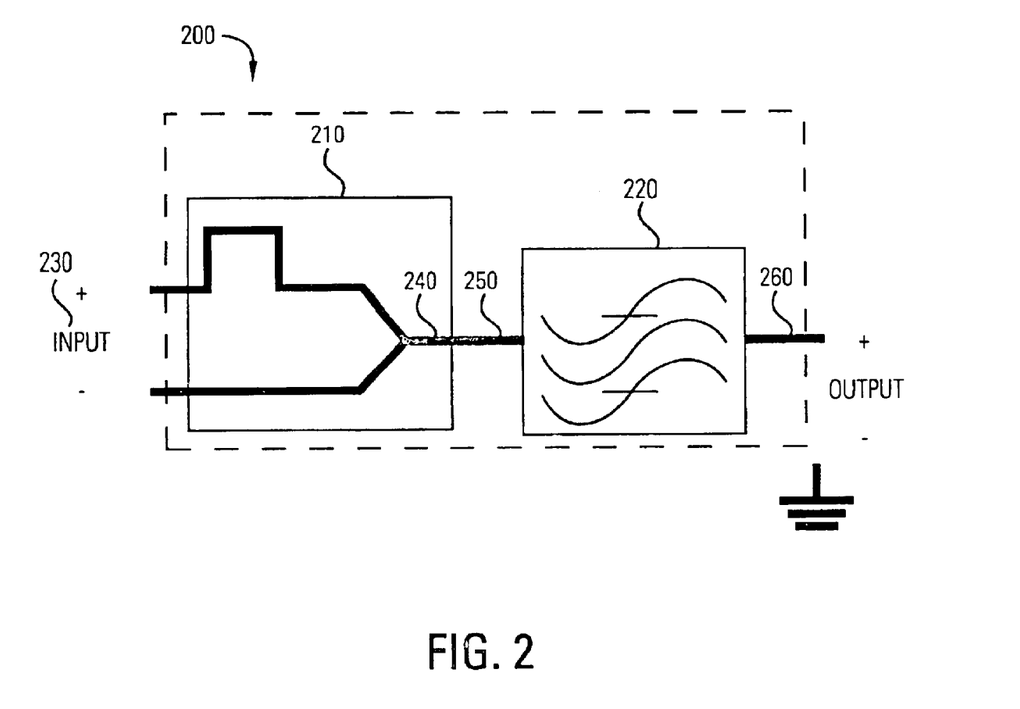
FIG. 2 illustrates a component has a differential input and a single-ended output and that employs a single-ended filter according to another embodiment of the present invention.

The components illustrated in FIGS. 1 and 2 both include a filter with single-ended inputs and single-ended outputs.

FIG. 1 illustrates a component 100 that has a single-ended input and a differential output and that employs a single-ended filter according to one embodiment of the present invention. The component 100 integrates a single ended filter 110 and an unbalanced to balanced circuit 120 (also referred to hereinafter as "balun"). The filter 110 includes a single-ended input 130 and a single-ended output 140.

The balun 120 includes a single-ended input 150 (which is also referred to herein as an unbalanced input) and a differential output 160 (which is also referred to herein as a balanced output). The differential output 160 of the balun 120 is the output of the component 100. The function of the balun is to move a signal from a differential form to a single ended form or from a single ended form to a differential form. One aspect of the present invention is to provide a filter function to the balun.

The input signal of the component 100 is processed by the filter 110 that is configured as a first stage and then further processed by the balun 120 that is configured as a second stage.

It is noted that although a band-pass filter is shown in FIGS. 1–4, it is to be appreciated that other types of filters may be utilized. These filters can include, but are not limited to, high pass filters, low-pass filters, and band-reject filters. Further, it is to be appreciated that the filters can be resonator-based. For example, a resonator-based filter may be designed by using film bulk acoustic resonators (FBARs) or surface acoustic wave (SAW) technology.

FIG. 2 illustrates a component 200 that has a differential input and a single-ended output and that employs a single-ended filter according to another embodiment of the present invention. The component 200 integrates a balanced to unbalanced circuit 210 (also referred to hereinafter as "balun") with a single ended filter 220. The balun 210 includes a differential input 230 (which is also referred to herein as a balanced input) and a single-ended output 240 (which is also referred to herein as an unbalanced output). The filter 220 includes a single-ended input 250 and a single-ended output 260, which is the output of the component 200.

The input signal of the component 200 is processed by the balun 210 that is configured as a first stage and then further processed by the filter 220 that is configured as a second stage.

Components Employing Filter With Differential Inputs and Outputs

Figure 3:
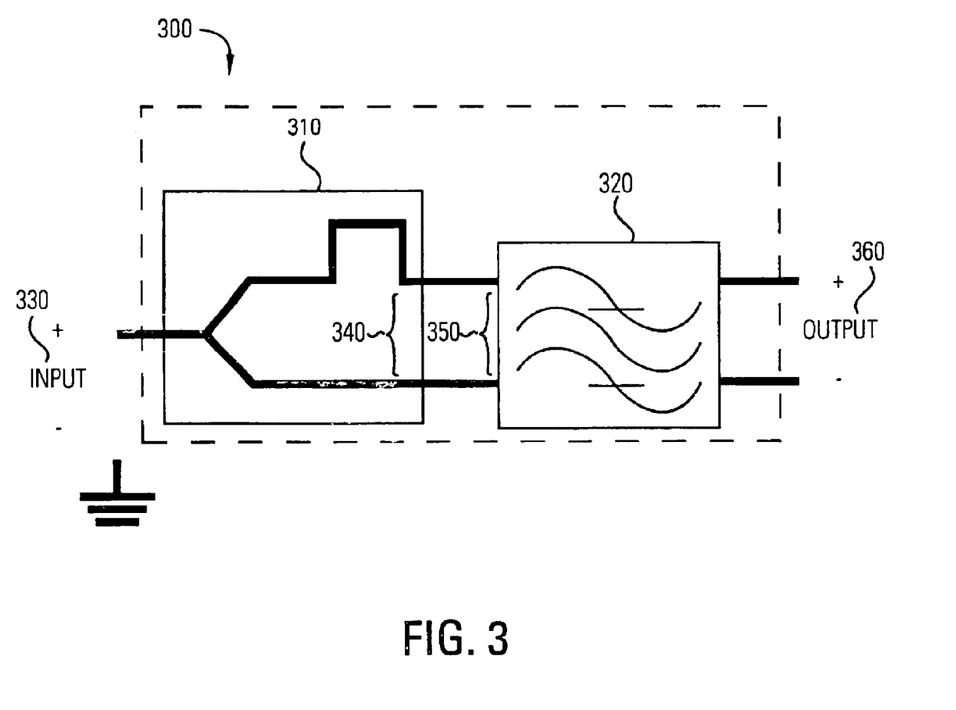
FIG. 3 illustrates a component that has a single-ended input and a differential output and that employs a differential filter according to one embodiment of the present invention.
Figure 4:
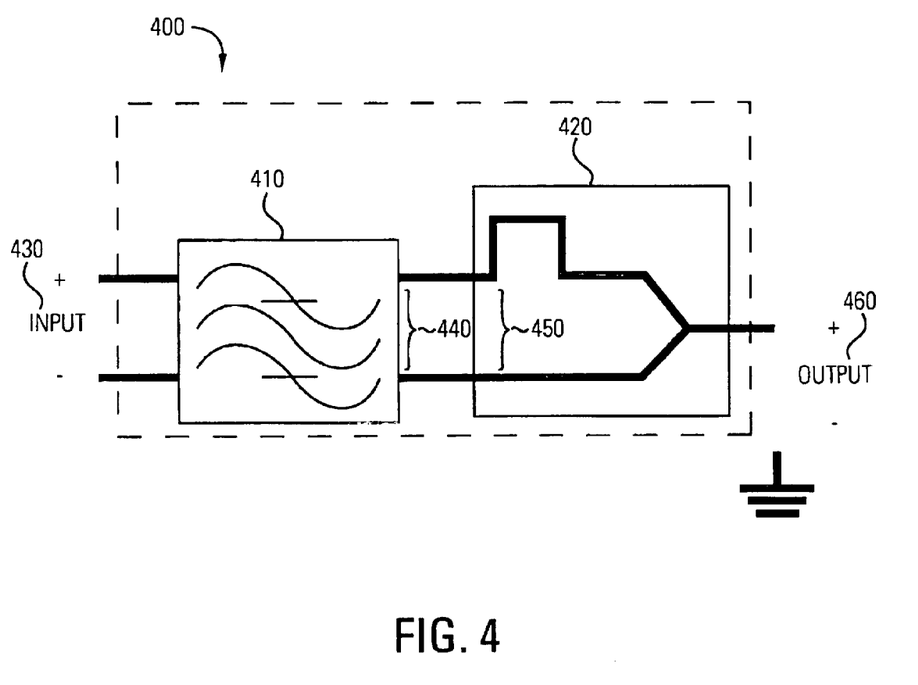
FIG. 4 illustrates a component has a differential input and a single-ended output and that employs a differential filter according to another embodiment of the present invention.

The components illustrated in FIGS. 3 and 4 both include a filter with differential inputs and differential outputs.

FIG. 3 illustrates a component 300 that has a single-ended input and a differential output and that employs a differential filter according to one embodiment of the present invention. The component 300 integrates a balanced to unbalanced circuit 310 (also referred to hereinafter as "balun") with a differential filter 320. The balun 310 includes a single-ended input 330 (i.e., an unbalanced input) and a differential output 340 (i.e., a balanced output). The filter 320 includes a differential input 350 (i.e., a balanced input) and a differential output 360 (i.e., a balanced output), which is the output of the component 300.

The input signal of the component 300 is processed by the balun 310 that is configured as a first stage and then further processed by the filter 320 that is configured as a second stage.

FIG. 4 illustrates a component 400 has a differential input and a single-ended output and that employs a differential filter according to another embodiment of the present invention. The component 400 integrates a differential filter 410 and a balanced to unbalanced circuit 420 (also referred to hereinafter as "balun"). The filter 410 includes a differential input 430 (i.e., a balanced input), which is the input of the component 400, and a differential output 440 (i.e., a balanced output). The balun 420 includes a differential input 450 (i.e., a balanced input) and a single-ended output 460 (i.e., an unbalanced output) that is the output of the component 400. The input signal of the component 400 is processed by the differential filter 410 that is configured as a first stage and then further processed by the balun 420 that is configured as a second stage.

It is noted that the inputs and outputs of the components illustrated in FIGS. 1–4 are interchangeable (i.e., the input ports may be used as output ports and the output ports may be used as input ports). The signal path through the integrated filter balun component of the present invention may be employed in either direction.

Half-adder Filter Implementation

Figure 5:
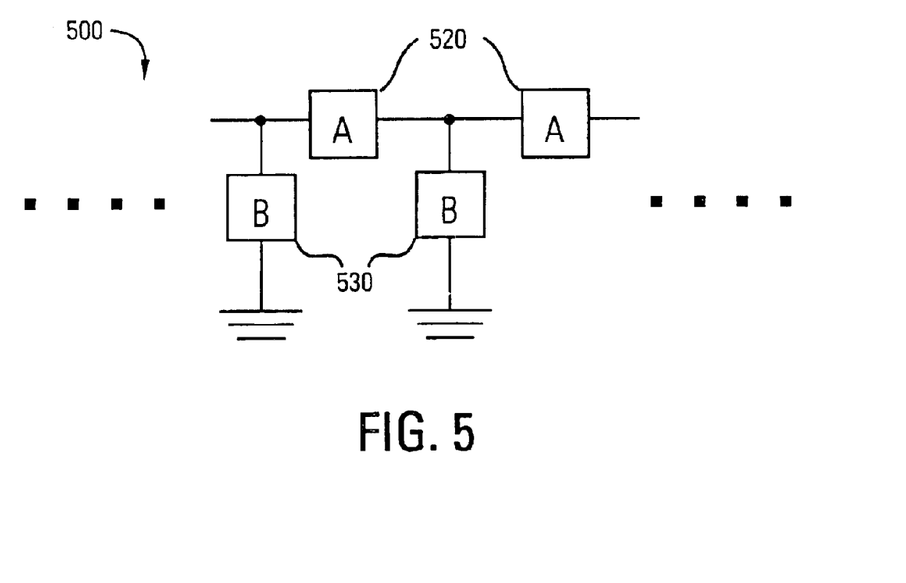
FIG. 5 illustrates an exemplary half ladder implementation of a resonator-based single-ended filter that can be used in the components illustrated in FIGS. 1 and 2 according to one embodiment of the present invention.

FIG. 5 illustrates an exemplary half ladder implementation of a resonator-based single-ended filter that can be used in the components illustrated in FIGS. 1 and 2 according to one embodiment of the present invention. The filter 500 includes a plurality of resonators. In this embodiment, the resonators are grouped into two different groups: a first group 520 of resonators that operate at a first resonator frequency A and a second group 530 of resonators that operate at a second resonator frequency B. When the resonant frequency A is greater than the resonant frequency B, the filter 500 is a filter having band pass characteristics (e.g., a bandpass filter). When the resonant frequency A is less than the resonant frequency B, the filter 500 is a filter having band reject characteristics (e.g., a band reject filter). This implementation of a single ended filter is referred to as a half-ladder implementation.

Full-ladder Filter Implementation

Figure 6:
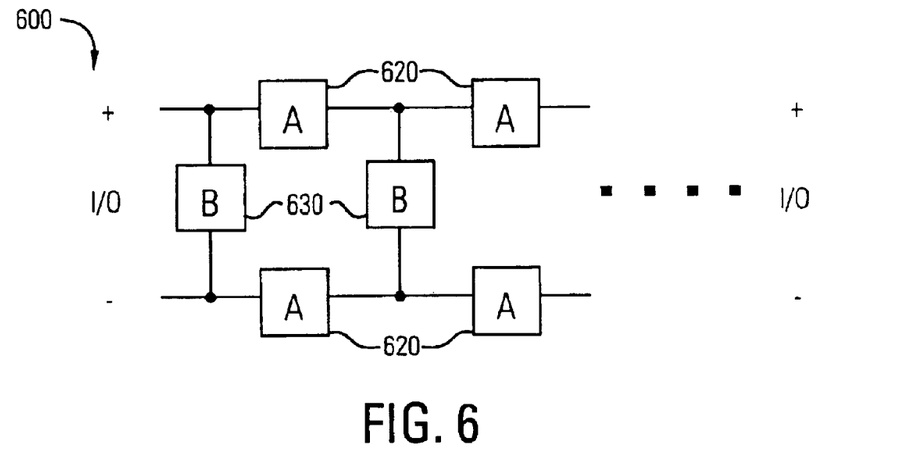
FIG. 6 illustrates an exemplary full ladder implementation of a resonator-based differential filter that can be used in the components illustrated in FIGS. 3 and 4 according to another embodiment of the present invention.

FIG. 6 illustrates an exemplary full ladder implementation of a resonator-based differential filter that can be used in the components illustrated in FIGS. 3 and 4 according to another embodiment of the present invention. The filter 600 includes a plurality of resonators. In this embodiment, the resonators are grouped into two different groups: a first group 620 of resonators that operate at a first resonator frequency A and a second group 630 of resonators that operate at a second resonator frequency B. When the resonant frequency A is greater than the resonant frequency B, the filter 600 is a filter having band pass characteristics (e.g., a bandpass filter). When the resonant frequency A is less than the resonant frequency B, the filter 600 is a filter having band reject characteristics (e.g., a band reject filter). This implementation of a differential filter is referred to as a fill-ladder implementation.

Lattice Filter Implementation

Figure 7:
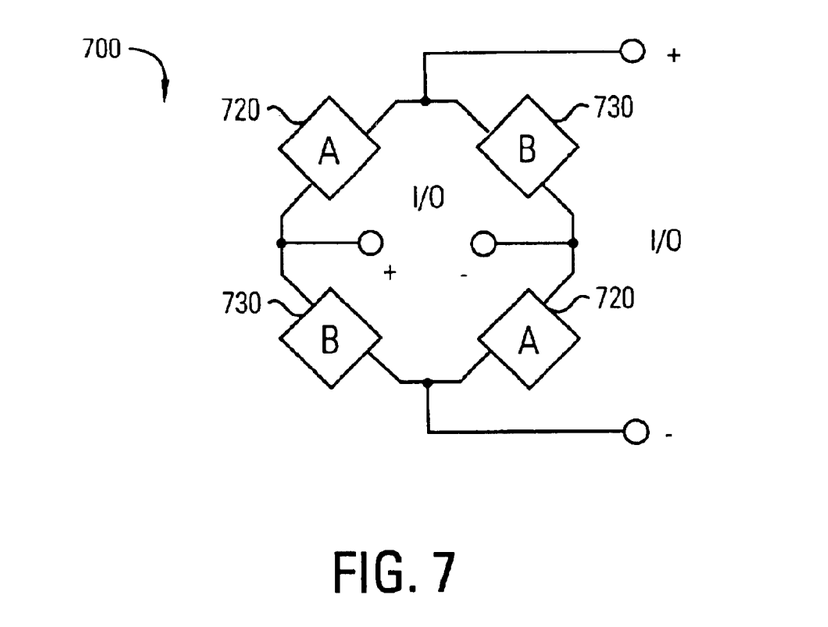
FIG. 7 illustrates an exemplary lattice implementation of a resonator-based differential filter that can be used in the components illustrated in FIGS. 3 and 4 according to another embodiment of the present invention.

FIG. 7 illustrates an exemplary lattice implementation of a resonator-based differential filter that can be used in the components illustrated in FIGS. 3 and 4 according to another embodiment of the present invention. The filter 700 includes a plurality of resonators. In this embodiment, the resonators are grouped into two different groups: a first group 720 of resonators that operate at a first resonator frequency A and a second group 730 of resonators that operate at a second resonator frequency B. This implementation of a differential filter is referred to as a lattice implementation.

Figure 12:
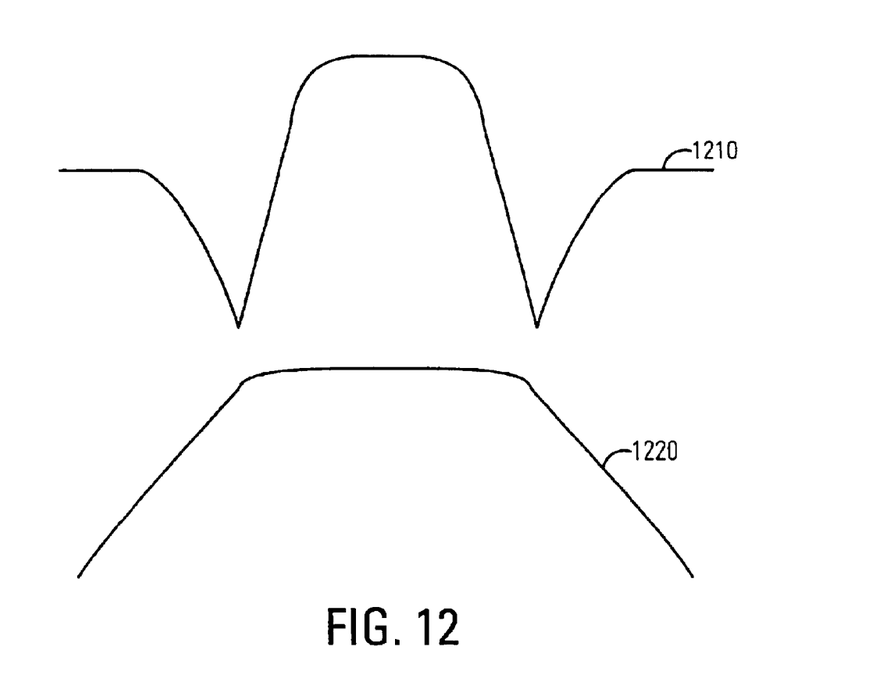
FIG. 12 illustrates the transmission response of both the ladder and the lattice type filters.

As in the ladder type filters, the lattice is symmetric with respect to the input and output ports. However, because of the deep symmetry of the lattice, the bandpass characteristic is always present when the resonator pairs are at different frequencies. The lattice reject characteristic is also quite different than the full ladder. In the reject bands, the full ladder network rejects very strongly close to the passband, but then becomes less effective at attenuation. A lattice does not reject strongly near the passband, but has strong rejection far from the passband. FIG. 12 illustrates the rejection characteristics of these types of filters. A first graph 1210 illustrates the rejection characteristics of ladder type filters, and a second graph 1220 illustrates the rejection characteristics of lattice type filters.

Exemplary Balun Implementations

There are numerous ways to implement the balun function. A first way to implement a balun function is to utilize coupled inductors as in a transformer. For example, a transformer may be made with two wires that are wrapped around a common ferrite core. A balun function can be realized by printing two nested inductors on a suitable substrate. Another technique to implement a balun function is to use broadside-coupled stripline. Yet another technique to implement a balun function is to utilize a coaxial cable.

Another technique to implement a balun function is to print two transmission lines, where one of the transmission lines has 180 degrees more phase shift. This technique is described in greater detail hereinafter with reference to FIG. 8. One can also synthesize the required 180-degree phase shift difference with discrete inductors and capacitors into what is commonly referred to as lumped equivalent transmission lines. This technique is described in greater detail hereinafter with reference to FIG. 9.

Figure 8:
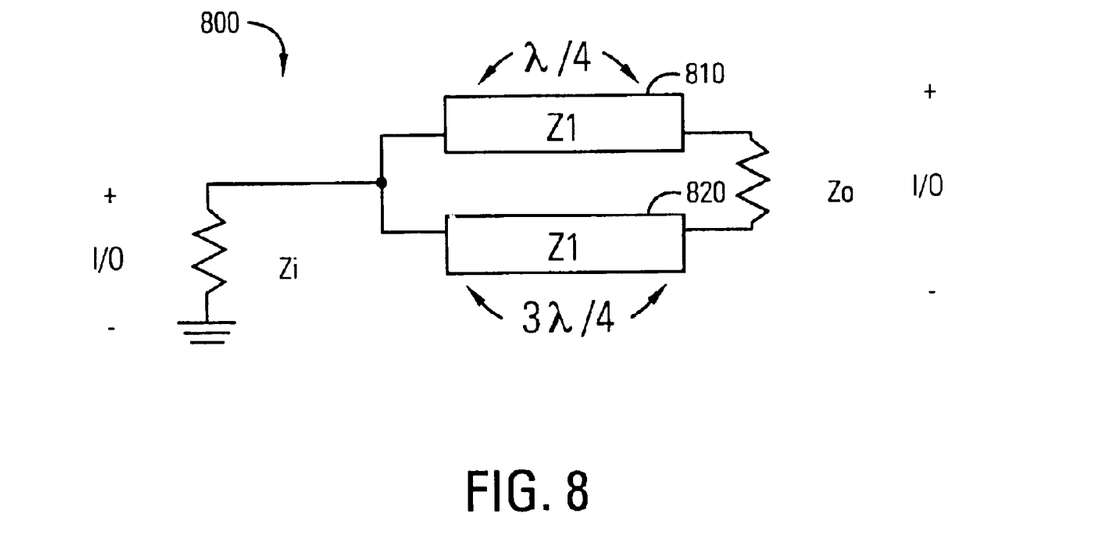
FIG. 8 illustrates a distributed balun that can be used in the components illustrated in FIGS. 1–4 according to one embodiment of the present invention.

FIG. 8 illustrates a balun implementation that employs transmission lines that can be used in the components illustrated in FIGS. 1–4 according to one embodiment of the present invention. The balun 800 converts signals between single ended circuits and differential circuits and further transforms the characteristic impedance therebetween. The balun 800 includes a first transmission line 810 for providing a first phase shift (e.g., one quarter of a wavelength) and a second transmission line 820 for providing a second phase shift (e.g., three-quarters of a wavelength). The characteristic impedance of the transmission lines can be described the following expression:

$$Zl = \sqrt{\frac{Z_1 * Z_0}{2}}$$

It is noted that there is a 180 degrees phase difference between signals traversing in the first transmission line 810 and in the second transmission line 820. In this embodiment, the length of the transmission lines may be varied in order to obtain different phase shifts.

Figure 9:
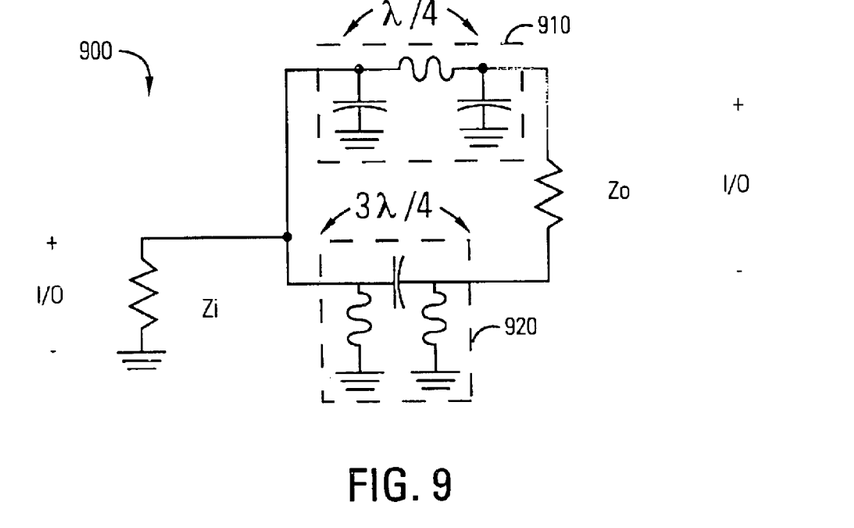
FIG. 9 illustrates a lumped balun that can be used in the components illustrated in FIGS. 1-4 according to one embodiment of the present invention.

An advantage of this approach over the approach that is described in greater detail hereinafter with reference to FIG. 9 is that the transmission lines act as impedance transformers. In this regard, further components are not needed to perform the impedance transformation.

FIG. 9 illustrates a lumped balun that can be used in the components illustrated in FIGS. 1–4 according to one embodiment of the present invention. In this embodiment, the transmission lines of the balun 800 are replaced with equivalent lumped circuits. For example, the first transmission line 810 is replaced with a first equivalent circuit 910, which can be, for example, two capacitors and an inductor configured as shown. Similarly, the second transmission line 820 is replaced with a first equivalent circuit 920, which can be, for example, two inductors and a capacitor configured as shown. It is noted that although the three-element transmission line approximation is sufficient to provide the 180-degree phase difference, the impedance transformation is not performed by the balun 800. Additional elements that are illustrated in FIG. 10 are needed to perform the impedance transformation.

Figure 10:
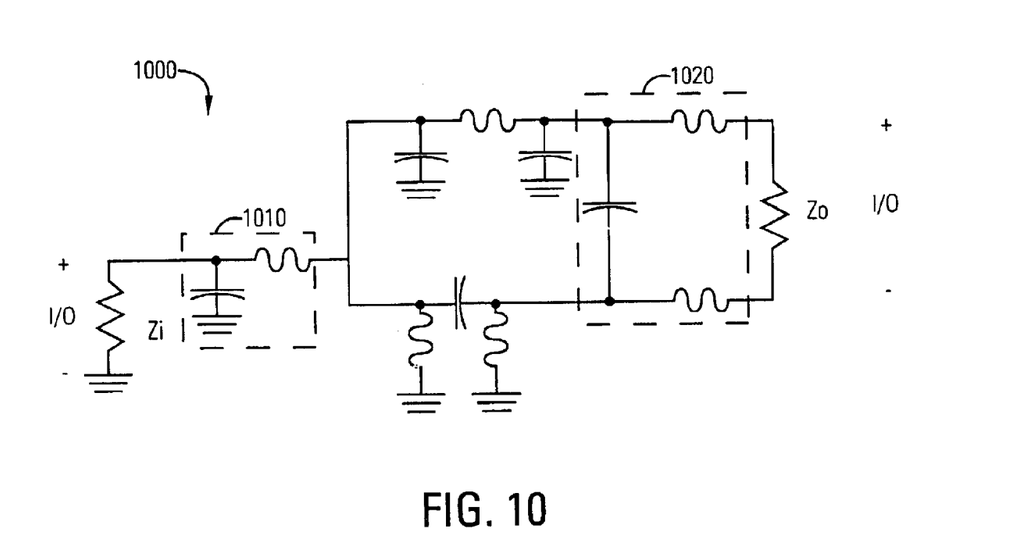
FIG. 10 illustrates the lumped balun of FIG. 9 that has additional elements for providing impedance transformation.

FIG. 10 illustrates the lumped balun of FIG. 9 that has additional elements for providing impedance transformation. A first group 1010 of lumped components is provided for matching the input impedance $Z_i$. A second group 1020 of lumped components is provided for matching the output impedance $Z_i$. The first group 1010 and the second group 1020 of lumped elements provide the impedance transformation functionality to the balun of FIG. 9 that is implemented with lumped elements.

One advantage of the integrated filter balun component of the present invention is that the component occupies an area that is comparable to the area needed to implement the balun alone. However, the integrated filter balun component of the present invention now provides a both the balun function and a filter function. Preferably, the first structure acts as a substrate for the second structure with the filter mounted on top of the balun substrate.

Figure 11:
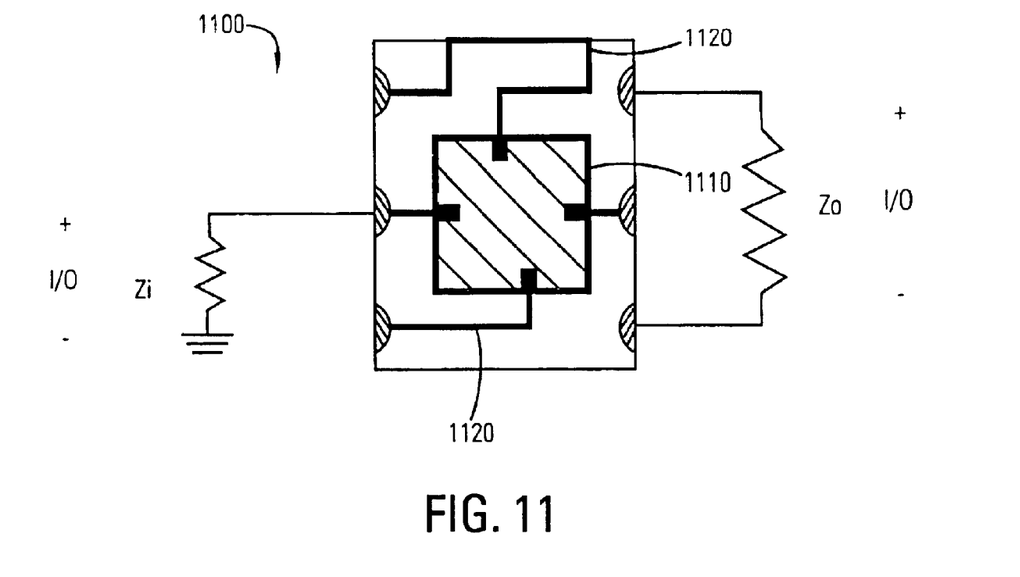
FIG. 11 illustrates an assembly with the filter and the balun according to one embodiment of the present invention.

FIG. 11 illustrates an assembly 1100 of the integrated filter and the balun according to one embodiment of the present invention. The assembly 1100 includes a filter 1110 and a balun that is buried under the filter 1110. The assembly 1100 also includes a plurality of transmission lines 1120.

The filter 1110 can be mounted on a balun structure in the following exemplary manners. For example, the filter 1110 can be die attached to the substrate that forms both the balun and also provides an area for this die attachment. The filter 1110 can either be bonded to the substrate or flip mounted. In the case of bonding, the electrodes of the filter 1110 are connected to the electrodes of the balun through the utilization of applied wires. In the case of flip mounting, the electrodes are configured such that one can flip the filter, and align the electrodes such that the electrodes can be directly connected. This connection can be either through the use of a conductive epoxy, through pressure contacting, or other techniques that are known to those of ordinary skill in the art.

One application in which the filter balun of the present invention can be utilized is the balanced mixer. The signal ports are all differential in the case of a triply balanced mixer (TBM). Two of three signal ports are differential in a doubly balanced mixer, and only one port is differential in a singly balanced mixer. Often, the mixing elements are simple diodes, which are single ended. Consequently, in order to balance the mixer, one must use two diodes for each balanced port. The diodes must be driven out of phase to be balanced. This balancing may be accomplished with a balun. For example, the filter balun of the present invention can be utilized to perform both a filtering function and a converting function (e.g., converting a differential input to a single ended output).

Compared to the prior art, the integrated filter balun of the present invention has the important benefit of being a single integrated component, thereby eliminating the need for designing RF and microwave circuits with two separate components: a filter component and a balun component.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A component comprising:
   a) a filter that includes a single ended input and a single ended output;
   b) a balanced to unbalanced circuit (balun) that includes a single ended port directly coupled to the single ended output of the filter and a differential port;
   wherein the balun is integrated with the filter.

2. The component of claim 1 further comprising a single ended input, a differential output, a first stage, and a second stage coupled to the first stage;
   wherein the filter is in the first stage;
   wherein the single ended input of the filter is coupled to the single ended input of the component;
   wherein the balun is in the second stage;
   wherein the single ended port of the balun is coupled to the singled ended output of the filter; and
   wherein the differential port of the balun is coupled to the differential output of the component.

3. The component of claim 1 further comprising a differential input, a single ended output, a first stage, and a second stage coupled to the first stage;
   wherein the balun is in the first stage;
   wherein the differential port of the balun is coupled to the differential input of the component;
   wherein the filter is in the second stage;
   wherein the single ended input of the filter is coupled to the single ended port of the balun; and
   wherein the single ended output of the filter is coupled to the single ended output of the component.

4. The component of claim 1 wherein the filter is one of a resonator-based filter, a filter that is implemented film bulk acoustic resonators (FBARs), and a filter that is implemented with surface acoustic wave (SAW) technology; and
   wherein the balun is implemented with one of at least two transmission lines and lumped elements that include inductors and capacitors.

5. A component comprising:
   a) a filter that includes a differential input and a differential output;
   b) a balanced to unbalanced circuit (balun) that includes a single ended port and a differential port;
   wherein the balun is integrated with the filter.

6. The component of claim 5 further comprising a single ended input, a differential output, a first stage, and a second stage coupled to the first stage;
   wherein the balun is in the first stage;
   wherein the single ended port of the balun is coupled to the singled ended input of the component;
   wherein the filter is in the second stage;
   wherein the differential input of the filter is coupled to the differential port of the balun; and
   wherein the differential output of the filter is coupled to the differential output of the component.

7. The component of claim 5 further comprising a differential input, a single ended output, a first stage, and a second stage coupled to the first stage;
   wherein the filter is in the first stage;
   wherein the differential input of the filter is coupled to the differential input of the component;
   wherein the balun is in the second stage;
   wherein the differential port of the balun is coupled to the differential output of the filter; and
   wherein the single ended port of the balun is coupled to the single ended output of the component.

8. The component of claim 5 wherein the filter is one of a resonator-based filter, a filter that is implemented film bulk acoustic resonators (FBARs), and a filter that is implemented with surface acoustic wave (SAW) technology; and
   wherein the balun is implemented with one of at least two transmission lines and lumped elements that include inductors and capacitors.

9. A component comprising:
   a) a first terminal for receiving a single-ended input;
   b) a second terminal and a third terminal for providing a differential output;
   c) a first structure that includes a first electrode coupled to the first terminal and a second electrode; and
   d) a second structure that includes a first electrode coupled to the second electrode of the first structure and a second electrode that is coupled to the second terminal and a third electrode that is coupled to the third terminal; wherein the second structure is integrated with the first structure; wherein the first structure is a balanced to unbalanced circuit (balun) and the second structure is a filter.

10. The component of claim 9 wherein the filter is implemented with a half-ladder resonator-based filter.

11. The component of claim 9 wherein the filter includes differential inputs and differential outputs.

12. The component of claim 11 wherein the filter is implemented with one of a full-ladder resonator-based filter and a lattice resonator-based filter.

13. The component of claim 9 wherein the balun is implemented with at least two transmission lines.

14. The component of claim 9 wherein the balun is implemented with lumped elements that include inductors and capacitors.

15. The component of claim 14, wherein the component includes input ports and output ports, the component further comprising at least two elements for performing impedance transformation at the input ports and at the output ports.

16. The component of claim 9 wherein the filter is one of a resonator-based filter, a filter that is implemented with film bulk acoustic resonators (FBARs) and a filter that is implemented with surface acoustic wave (SAW) technology.

17. The component of claim 9
   wherein the first structure acts as a substrate for the second structure, and the second structure is one of bonded to the first structure and flip-mounted on the first structure.

* * * * *